United States Patent
Replogle et al.

(10) Patent No.: US 6,704,198 B2
(45) Date of Patent: Mar. 9, 2004

(54) EQUIPMENT ENCLOSURE WITH HEAT EXCHANGER

(75) Inventors: Kris K. Replogle, Brookside, NJ (US); Quang Duong, Denville, NJ (US)

(73) Assignee: Avava Technology Corp., Basking Ridge, NJ (US)

( * ) Notice: Subject to any disclaimer, the term of this patent is extended or adjusted under 35 U.S.C. 154(b) by 46 days.

(21) Appl. No.: 10/170,659

(22) Filed: Jun. 12, 2002

(65) Prior Publication Data

US 2003/0231467 A1 Dec. 18, 2003

(51) Int. Cl.⁷ .............................................. H05K 7/20
(52) U.S. Cl. .................... 361/690; 361/694; 361/695; 361/696; 174/16.1; 165/104.33; 165/122; 454/184
(58) Field of Search ............................... 361/678, 689, 361/690–696; 174/16.1; 165/80.3, 104.33, 122; 454/184

(56) References Cited

U.S. PATENT DOCUMENTS

| | | | |
|---|---|---|---|
| 4,949,218 A | | 8/1990 | Blanchard et al. .......... 165/122 |
| 5,063,477 A | * | 11/1991 | Paggen et al. ............. 361/695 |
| 5,105,336 A | * | 4/1992 | Jacoby et al. .............. 361/690 |
| 5,688,169 A | | 11/1997 | Duong et al. .............. 454/184 |
| 5,832,988 A | * | 11/1998 | Mistry et al. .............. 165/103 |
| 6,151,212 A | * | 11/2000 | Schwenk et al. ............ 361/695 |
| 6,407,533 B1 | * | 6/2002 | Bartek et al. ............. 320/150 |
| 6,459,579 B1 | * | 10/2002 | Farmer et al. ............. 361/695 |

FOREIGN PATENT DOCUMENTS

| | | | | |
|---|---|---|---|---|
| GB | 2197536 A | * | 5/1988 | ............ H05K/7/20 |
| JP | 356147458 A | * | 11/1981 | ................. 361/694 |

* cited by examiner

Primary Examiner—Boris Chervinsky
(74) Attorney, Agent, or Firm—Thomas, Kayden, Horstemeyer & Risley, LLP

(57) ABSTRACT

An equipment enclosure (12) includes an interior cavity (16) housing a plurality of equipment compartments (22) configured to form vertical stacks, and a lower compartment (24) for housing batteries and/or other equipment. Airflow through the lower compartment (24) is isolated from airflow within the interior cavity (16). Heat exchangers (52, 54) are included for cooling internal air circulating air within the equipment enclosure (12) with external ambient air. Each heat exchanger (52, 54) draws external ambient air indirectly through the lower compartment (24) and directly from the external environment, and exhausts the air back to the external environment. The external ambient airflow through each heat exchangers (52, 54) is used to cool internal air circulating within the enclosure (12). The cooled internal air is provided through an opening (38) positioned proximate the bottom of the interior cavity (16). Air baffles (28) are positioned between each pair of vertically adjacent equipment compartments (22) to prevent internal air from flowing vertically through vertically adjacent equipment compartments (22).

8 Claims, 2 Drawing Sheets

EQUIPMENT ENCLOSURE WITH HEAT EXCHANGER

FIELD OF THE INVENTION

The present invention relates to equipment enclosures, and specifically to equipment enclosures comprising heat exchangers.

BACKGROUND OF THE INVENTION

Equipment enclosures for housing electronics and telecommunications equipment, such as telephone equipment and optical fiber systems, for use in indoor and outdoor environments are well known. As the use of telecommunications systems and optical fiber systems has proliferated, greater numbers of equipment enclosures are found in a variety of locations, such as industrial parks, commercial installations, and residential areas.

Improvements in the design and construction of electronics, telecommunications, and optical fiber equipment and systems, have resulted in power densities and temperatures of these equipment and systems to increase. Furthermore, at least one battery is oftentimes provided for use with the equipment housed within these enclosures. As known to those skilled in the art, typically, as the temperature of the equipment increases, the performance of the equipment, and the system of which the equipment is a part, degrades. In similar fashion, and as also known in the art, sustained increases in the temperature of the battery within the enclosure tends to decrease the service life of the battery, necessitating costly servicing and/or replacement of the battery. As a result thereof, manufacturers and providers of equipment enclosures and telecommunications systems have been seeking ways to cool the equipment housed within these enclosures.

Examples of attempts to cool equipment housed within an equipment enclosure are disclosed in U.S. Pat. No. 4,949,218, issued to Blanchard, et al.; U.S. Pat. No. 5,570,740, issued to Flores, et al.; U.S. Pat. No. 5,603,376, issued to Hendrix; U.S. Pat. No. 5,765,743, issued to Sakiura et al.; and U.S. Pat. No. 5,832,988, issued to Mistry, et al. Common among these patents, is the construction of a heat exchanger or heat exchanging system directly within the enclosure, also referred to as an equipment cabinet, for the purpose of drawing and/or passing ambient air from outside the equipment enclosure through the enclosure for the purpose of cooling the equipment housed therein. Heat is exchanged through the use of structures that are relatively complicated in construction, and which increase the size, and necessarily the expense, of the enclosure in order to house the telecommunications or electronics equipment and the heat exchange system.

In situations where the heat exchanger is located in a central portion of the enclosure, the shelves carrying the equipment are necessarily limited in depth, and access to the heat exchanger is typically limited, thus making replacement or repair of the heat exchanger difficult.

Another problem with current equipment enclosures is the formation of a large temperature gradient within the equipment enclosure wherein the equipment mounted near the top of the enclosure is typically about 4 to 5 degrees Centigrade hotter than the equipment mounted near the bottom of the enclosure. What is needed, therefore, is an equipment cabinet of simple and inexpensive construction, which provides relatively easy access to heat exchangers, wherein the formation of a large temperature gradient is mitigated, and the depth of the equipment shelves is not necessarily limited by the heat exchangers.

SUMMARY OF THE INVENTION

An equipment enclosure includes a plurality of equipment compartments configured to form at least one vertical stack of equipment compartments. Each equipment compartment is adapted to receive equipment. The equipment compartments are positioned within an interior cavity of the enclosure. The enclosure includes at least one heat exchanger for cooling internal air circulating within the equipment enclosure. An air baffle is positioned between each pair of vertically adjacent equipment compartments to prevent internal air from flowing vertically through adjacent equipment compartments.

BRIEF DESCRIPTION OF THE DRAWINGS

The invention is best understood from the following detailed description when read in connection with the accompanying drawings. The various features of the drawings may not be to scale. Included in the drawing are the following figures.

DETAILED DESCRIPTION

Figure 1:
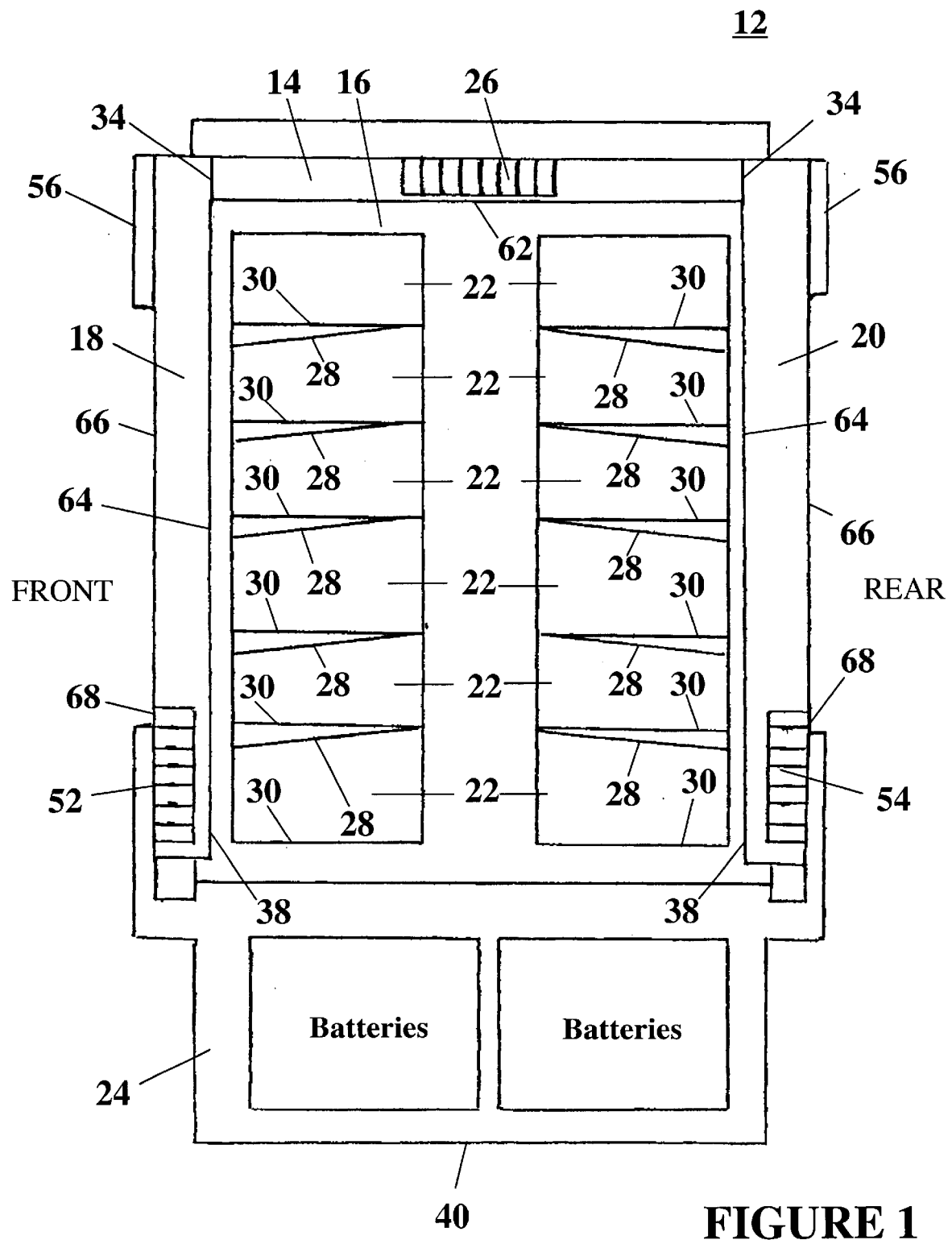
FIG. 1 is a side cross sectional view of an equipment enclosure in accordance with the present invention.

This description of embodiments is intended to be read in connection with the accompanying drawing(s), which are to be considered part of the entire written description of this invention. In the description, relative terms such as "horizontal," "vertical," "up," "down," "top", "bottom", "front", "back", "forward", and "rearward", as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling, or connection that allows the pertinent structures to operate as intended by virtue of that relationship.

Generally, an equipment enclosure as described herein includes an interior cavity formed within the enclosure. Within the interior cavity is a plurality of equipment compartments configured to form vertical stacks of equipment compartments. Types of equipment placed in the equipment compartments include heat generating equipment such as telecommunications, electronic, an fiber optic equipment. The equipment enclosure also includes a lower compartment for housing batteries and/or other equipment. Airflow within and through the lower compartment is isolated from airflow within and through the interior cavity. At least one heat exchanger is included for cooling internal air circulating within the equipment enclosure with external ambient air provided by an external environment outside of the enclosure. Each heat exchanger draws external ambient air through the lower compartment and directly from the external environment, and exhausts the air back to the external environment. The external ambient airflow through each heat exchanger is used to cool internal air circulating within the enclosure. Air baffles are positioned between each pair of vertically adjacent equipment compartments to prevent internal air from flowing vertically through vertically adjacent equipment compartments. Also, each heat exchanger provides cooled internal air proximate to the bottom of the interior cavity. The creation of a large temperature gradient is mitigated by the positioning of the baffles and the positioning of the opening, which provides cooled internal air proximate the bottom of the interior cavity.

FIG. 1 is a side cross sectional view of an equipment cabinet 12. Note, the terms "enclosure" and "cabinet" are used interchangeably herein. Equipment cabinet 12 comprises a first heat exchanger 18 positioned on the front side of cabinet 12, a second heat exchanger 20 positioned on the rear side of cabinet 12, an upper fan bay 14, an interior cavity 16, lower compartment 24, equipment compartments 22, shelves 30, at least one fan 26, heat exchanger fans 52 and 54, and air baffles 28. Interior cavity 16 is defined by upper bay 14, heat exchangers 18, 20, and lower compartment 24. The equipment compartments 22 are positioned within the interior cavity 16. In one embodiment of the enclosure 12, equipment compartments 22 are arranged in two vertical stacks respectively positioned proximate the front and rear of enclosure 12, respectively. Not visible in FIG. 1 are openings 34, 38, 62, 56, 68, and 40. As will be explained in detail herein, openings 34, 38, and 62 facilitate internal airflow and openings 56, 68, and 40 facilitate external (external with respect to the enclosure 12) ambient airflow.

As shown in FIG. 1, batteries are schematically illustrated positioned within the lower compartment 24 of the enclosure 12. However, lower compartment 24 may comprise any appropriate equipment or apparatus, such as heat generating equipment including any type of telecommunications, electronic, or optical fiber equipment of the type commonly housed, or intended to be housed, within an equipment enclosure, for example. Furthermore, lower compartment 24 may be used for storage, or may be empty. Similarly, it is envisioned that heat generating electronic equipment is positioned in at least one of the equipment compartments 22. The electronic equipment may comprise, for example, any type of telecommunications, electronic, or optical fiber equipment of the type commonly housed, or intended to be housed, within an equipment enclosure. Furthermore, fan 26 may comprise a single fan or a plurality of fans. Also, fan 68 may comprise a single fan or a plurality of fans. The fans may comprise any type of fan known in the art, suitable for cooling equipment housed in enclosure 12. Furthermore, although FIG. 1 shows two heat exchangers 18, 20, and two vertical stacks of equipment compartments 22, other configurations are envisioned in accordance with the present invention. For example, enclosure 12 may comprise greater than one heat exchanger on each of the front and rear sides of enclosure 12. Also, enclosure 12 may comprise greater than one vertical stack of equipment compartments 22 positioned proximate to each of the front and rear sides of enclosure 12.

Figure 2:
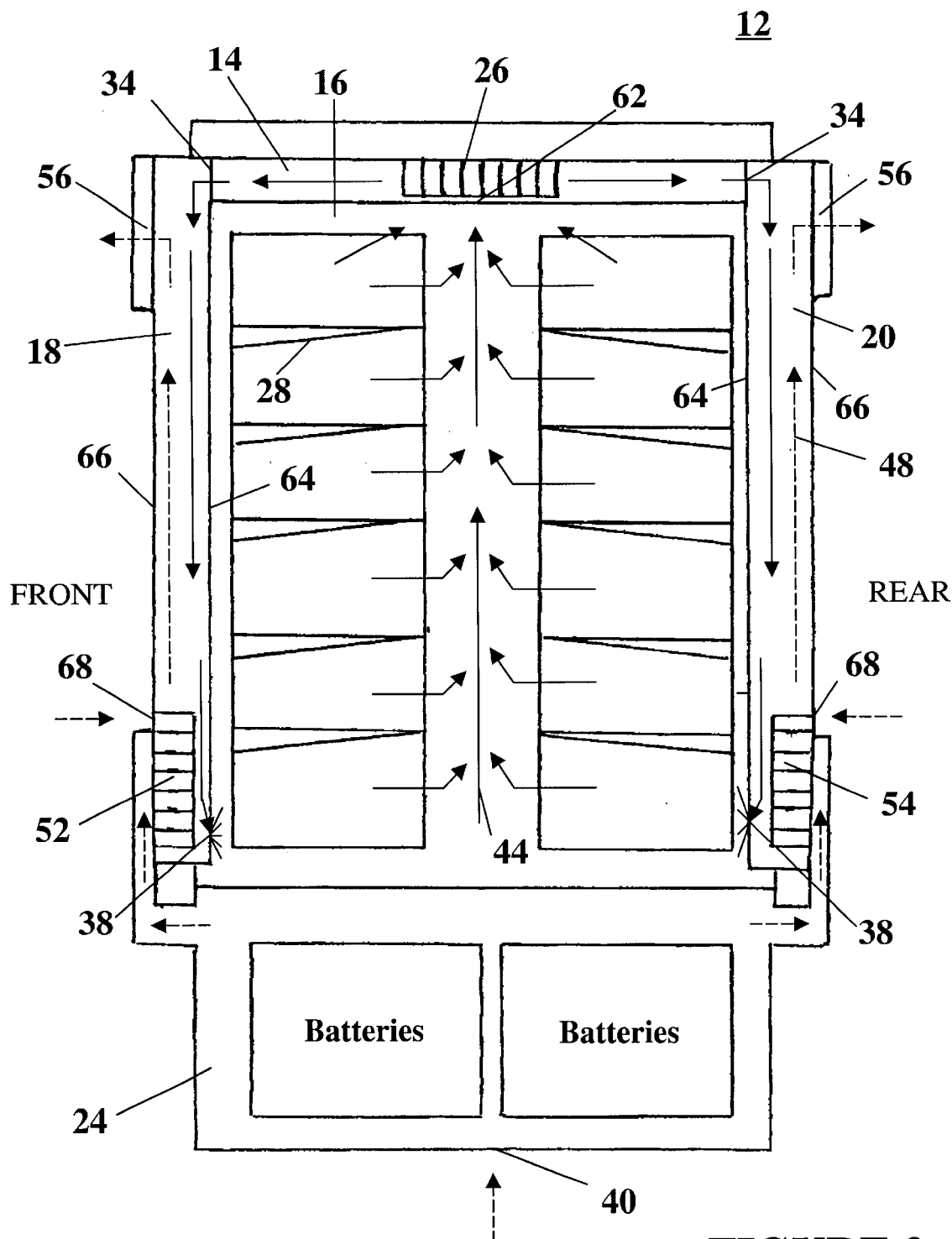
FIG. 2 is a side cross sectional view of the enclosure showing airflow in accordance with the present invention.

FIG. 2 is a side cross sectional view of the enclosure 12 showing airflow. Openings 34 pneumatically couple the heat exchangers 18, 20, to the upper fan bay 14. Openings 38 pneumatically couple the heat exchangers 18, 20, to the interior cavity 16. Opening 62 pneumatically couples the interior cavity 16 to the fan bay 14. Openings 56 and 68 pneumatically couple the external environment to the heat exchangers 18, 20, and opening 40 pneumatically couples the external ambient environment to the lower compartment 24.

Solid arrows 44 indicate internal airflow and dashed arrows 48 indicate airflow of external ambient air through the lower compartment 24 and the heat exchangers 18, 20. Interior cavity 16 is sealed from external ambient air when the enclosure 12 is closed, thus the internal airflow is separated from the flow of external ambient air. A vent or opening 40 is defined within the lower compartment 24 for allowing external ambient air to enter into the compartment 24 for cooling the lower compartment 24 and any apparatus contained therein, such as a battery, or batteries. Vents or openings 68 are defined within the exterior surfaces 66 of the heat exchangers 18, 20, for allowing external ambient air to enter the heat exchangers 18 and 20 through fans 52 and 54, respectively. As shown in FIG. 2, external ambient air is drawn into the enclosure 12 through vents or openings 40 and 68, through the fans 52 and 54 of heat exchangers 18 and 20, respectively. The external ambient air, which is drawn into the enclosure 12, is exhausted back to the external environment through heat exchanger vents or openings 56.

Internal airflow is indicated by solid arrows 44. Fan 26 draws internal air from the interior cavity 16 and provides that air to the heat exchangers 18 and 20 through openings 34. This internal air is then cooled by the heat exchangers 18, 20, and enters the interior cavity 16 via openings 38. One baffle 28 is positioned between each pair of vertically adjacent equipment compartments 22. Baffles 28 guide internal airflow horizontally through the equipment compartments 22. Baffles 28 prevent the internal airflow from flowing vertically through vertically adjacent equipment compartments 22. Thus, internal air, which is warmed by heat generating equipment positioned in an equipment compartment 22, is prevented from flowing to a vertically adjacent equipment compartment. This restriction of vertical airflow through vertically adjacent equipment compartments 22, prevents internal air from being increasingly warmed by flowing vertically through a plurality of equipment compartments 22 comprising heat generating equipment. Accordingly, the creation of a large temperature gradient between the top and bottom of the interior cavity 16 is mitigated. Baffles 28 may comprise any baffle known in the art suitable for preventing the internal airflow from flowing vertically through equipment compartments 22, such as a metallic plate, for example.

Openings 38 are positioned to facilitate mitigation of a large temperature gradient. Openings 38 are positioned proximate the bottom of interior cavity 16 so that internal air flowing through the heat exchangers 18, 20, will be sufficiently cooled before entering interior cavity 16. Also, positioning the openings 38 proximate the bottom of interior cavity 16 prevents internal air, that has not been sufficiently cooled, from being provided to equipment compartments 22 that are more susceptible to heating due to being positioned toward the top of the interior cavity 16. For example, if openings were positioned adjacent the top equipment compartments 22 of each vertical stack of equipment compartments 22, air provided by fan 26 would enter the heat exchangers 18, 20, through openings 34 and immediately reenter the interior cavity 16. This would essentially amount to circulating warm air, not providing sufficient cooling, and possibly contributing to the formation of a large temperature gradient between the top and bottom of the interior cavity 16.

The heat exchangers 18, 20 comprise an interior planar panel 64 and an exterior surface 66, which form a plenum (plenum not shown) through which ambient external air is passed. This is accomplished by providing first openings 68 and second openings 56 defined in the exterior surface 66 of the heat exchangers 18, 20. Each heat exchanger 18, 20, comprises at least one fan 54, which is mounted on the exterior surface 66. So constructed, fans 54 may be used to selectively draw ambient air through vent opening 40 and the lower battery compartment 24, and through vent openings 68, which passes through the plenum for cooling heat exchanger cores (core not shown) such that circulating internal air is cooled. This air flow path of the ambient air, as shown by dashed lines 48, may be selectively reversed based on the needs and desires of an end user, by reversing the direction of fans 52.

The heat exchangers 18, 20, may be attached to the equipment enclosure 12 by any appropriate means, including any type of suitable hinge, or other construction used for fastening a door to an equipment enclosure. For example, the heat exchangers 18, 20, may be constructed to lift off of the enclosure 12, or could be constructed to include a 4-bar linkage or other known type of mechanism adapted for allowing access to the heat exchangers 18, 20, and interior cavity 16. In other embodiments of the enclosure 12, heat exchangers 18, 20, comprise covers, which may snap fit or press fit onto the enclosure 12, or a series of threaded fasteners of the type commonly used to restrict access into telecommunications racks, cabinets, or enclosures could be passed through the heat exchangers 18, 20, and threaded nuts passed over the fasteners on the inside of the enclosure 12, such that the heat exchanger covers cannot be removed without first opening a door mounted on equipment enclosure 12. Also, it is envisioned that the enclosure 12 will be provided with a suitable conventional locking device such that the enclosure 12 cannot be opened by other than those with a need and the authority to enter the enclosure 12. Enclosure 12 may comprise a bracket or arm for holding the heat exchangers 18, 20, in an open position when access is needed into the interior compartments of the enclosure 12 (bracket or arm not shown in FIGS. 1 and 2).

Many advantages are provided by an enclosure 12 in accordance with the present invention. Some of which are described herein. Enclosure 12 is particularly applicable to outdoor environments, because the internal airflow is not contaminated by the flow of external ambient air. Thus, equipment positioned within the interior cavity 16 are effectively protected from weather conditions including extreme humidity, rain, snow, and extreme arid conditions. Enclosure 12 also provides relatively convenient access to the heat exchangers 18, 20, because the heat exchangers 18, 20, are positioned along the outer portions of the front and rear sides of the enclosure 12, in contrast to being positioned between the equipment compartments 22 or in the center of the interior cavity 16. Enclosure 12 provides an efficient use of space within interior cavity 16 by positioning the heat exchangers 18, 20, outside of the interior cavity 16, thus providing more space for the equipment compartments 22. Yet another advantage of enclosure 12 is that a large temperature gradient is mitigated by the positioning of openings 38 proximate to the bottom of the interior cavity 16, and by the baffles 28 preventing airflow to vertically adjacent equipment compartments 22.

Although several embodiments of the invention have been disclosed in the foregoing specification, it is understood by those skilled in the art that many modifications and other embodiments of the invention will come to mind to which the invention pertains, having the benefit of the teaching presented in the foregoing description and the associated drawings. It is thus understood that the invention is not limited to the specific embodiments disclosed herein, and that many modifications and other embodiments of the invention are intended to be included within the scope of the appended claims.

What is claimed is:

1. An equipment enclosure comprising:
    a plurality of equipment compartments configured to form at least one vertical stack of equipment compartments, each of said plurality of equipment compartments adapted to receive equipment, said plurality of equipment compartments positioned within an interior cavity of said enclosure;
    at least one heat exchanger for cooling internal air circulating within said equipment enclosure, said at least one heat exchanger located outside of said internal cavity; and
    at least one air baffle, wherein:
        one baffle is positioned between each pair of vertically adjacent equipment compartments; and
        said at least one baffle prevents said internal air from flowing vertically through adjacent equipment compartments.

2. An equipment enclosure in accordance with claim 1, wherein said internal air is provided by said at least one heat exchanger proximate a bottom of said interior cavity.

3. An equipment enclosure in accordance with claim 1, further comprising at least one fan for drawing air from said interior cavity and providing said internal air to said at least one heat exchanger.

4. An equipment enclosure in accordance with claim 1, wherein said equipment comprises at least one of telecommunications equipment, electronic equipment, and optical fiber equipment.

5. An equipment enclosure in accordance with claim 1, further comprising a lower compartment pneumatically isolated from said interior cavity.

6. An equipment enclosure in accordance with claim 5, wherein said lower compartment is adapted to receive at least one of equipment and battery.

7. An equipment enclosure in accordance with claim 4, wherein external ambient air is drawn from an environment external to said interior cavity, through said lower compartment, through said at least one heat exchanger, and back to said external environment.

8. An equipment enclosure comprising:
    an interior cavity formed within said enclosure;
    a plurality of equipment compartments positioned within said interior cavity, said plurality of equipment compartments configured to form at least one vertical stack of equipment compartments, each of said plurality of equipment compartments adapted to receive equipment, wherein said equipment comprises heat generating equipment;
    a lower compartment isolated from said interior cavity, said lower compartment adapted to receive at least one of a battery and equipment;
    at least one heat exchanger for cooling internal air circulating within said equipment enclosure with external air provided by an external environment, said at least one heat exchanger located outside of said internal cavity, wherein airflow of said external air is isolated from airflow of internal air, each heat exchanger comprising:
        a first external opening for receiving external ambient air directly from said external environment and indirectly from said external environment through said lower compartment;
        a second external opening for providing external ambient air to said external environment;
        a first internal opening for providing internal air to said interior cavity, wherein said internal opening is positioned proximate a bottom of said interior cavity; and
    at least one air baffle, each one of said at least one air baffle being positioned between a respective pair of vertically adjacent equipment compartments, wherein said at least one baffle prevents said internal air from flowing vertically through adjacent equipment compartments.

* * * * *